(12) United States Patent
Xie et al.

(10) Patent No.: US 11,387,309 B2
(45) Date of Patent: Jul. 12, 2022

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Chunyan Xie, Beijing (CN); Song Zhang, Beijing (CN); Ziyu Zhang, Beijing (CN); Chengjie Qin, Beijing (CN); Pinfan Wang, Beijing (CN); Penghao Gu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 185 days.

(21) Appl. No.: 16/960,096

(22) PCT Filed: Feb. 14, 2020

(86) PCT No.: PCT/CN2020/075286
§ 371 (c)(1),
(2) Date: Jul. 6, 2020

(87) PCT Pub. No.: WO2020/192293
PCT Pub. Date: Oct. 1, 2020

(65) Prior Publication Data
US 2021/0257434 A1    Aug. 19, 2021

(30) Foreign Application Priority Data
Mar. 28, 2019   (CN) .......................... 201910245542.8

(51) Int. Cl.
*H01L 27/32*       (2006.01)
*H01L 51/00*       (2006.01)
(Continued)

(52) U.S. Cl.
CPC ...... *H01L 27/3276* (2013.01); *H01L 51/0097* (2013.01); *H01L 51/5253* (2013.01);
(Continued)

(58) Field of Classification Search
None
See application file for complete search history.

(56) References Cited

U.S. PATENT DOCUMENTS

| 10,978,669 B2 * | 4/2021 | Lee .......................... H01L 51/56 |
| 2014/0151662 A1 * | 6/2014 | Inoue .................. H01L 51/0085 257/40 |

(Continued)

FOREIGN PATENT DOCUMENTS

| CN | 107425036 A | 12/2017 |
| CN | 107994052 A | 5/2018 |

(Continued)

OTHER PUBLICATIONS

Office Action dated Mar. 2, 2020 for Chinese Patent Application No. 201910245542.8 and English Translation.
(Continued)

*Primary Examiner* — J. E. Schoenholtz
(74) *Attorney, Agent, or Firm* — Ling Wu; Stephen Yang; Ling and Yang Intellectual Property (57) ABSTRACT

Provided are a display substrate and a preparation method thereof, and a display apparatus. The display substrate includes a base substrate, a plurality of pixel island regions distributed in an array and spaced apart from each other, a plurality of aperture regions, and connection bridge regions located between pixel island regions and aperture regions, which are disposed on the base substrate, wherein the connection bridge region is provided with an isolation structure layer for cutting off an organic emitting layer and a cathode in the connection bridge region.

15 Claims, 6 Drawing Sheets

(51) Int. Cl.
    *H01L 51/52*     (2006.01)
    *H01L 51/56*     (2006.01)
    *H01L 51/50*     (2006.01)

(52) U.S. Cl.
    CPC .......... *H01L 51/56* (2013.01); *H01L 27/3246* (2013.01); *H01L 51/5012* (2013.01); *H01L 51/5221* (2013.01); *H01L 2227/323* (2013.01); *H01L 2227/326* (2013.01); *H01L 2251/5338* (2013.01)

(56) References Cited

U.S. PATENT DOCUMENTS

| | | |
|---|---|---|
| 2016/0260924 A1 | 9/2016 | Lee et al. |
| 2017/0338294 A1 | 11/2017 | Choi et al. |
| 2018/0090699 A1* | 3/2018 | Shin ................. H01L 51/56 |
| 2018/0114825 A1 | 4/2018 | Hong et al. |
| 2019/0267558 A1 | 8/2019 | Wang et al. |
| 2019/0355929 A1 | 11/2019 | Xu |
| 2020/0027936 A1 | 1/2020 | Wang et al. |
| 2020/0075698 A1* | 3/2020 | Yang ................. H01L 27/3258 |

FOREIGN PATENT DOCUMENTS

| | | |
|---|---|---|
| CN | 108389884 A | 8/2018 |
| CN | 108574054 A | 9/2018 |
| CN | 108682751 A | 10/2018 |
| CN | 108899352 A | 11/2018 |
| CN | 109427818 A | 3/2019 |
| CN | 109935730 A | 6/2019 |
| WO | 2019200862 A1 | 10/2019 |

OTHER PUBLICATIONS

Office Action dated May 20, 2020 for Chinese Patent Application No. 201910245542.8 and English Translation.
Office Action dated Aug. 24, 2020 for Chinese Patent Application No. 201910245542.8 and English Translation.
International Search Report for PCT/CN2020/075286 dated Apr. 24, 2020.

* cited by examiner

DISPLAY SUBSTRATE AND PREPARATION METHOD THEREOF, AND DISPLAY APPARATUS

CROSS-REFERENCE TO RELATED APPLICATIONS

The present application is a U.S. National Phase Entry of International PCT Application No. PCT/CN2020/075286 having an international filing date of Feb. 14, 2020, which claims the priority of Chinese patent application No. 201910245542.8, filed to the CNIPA on Mar. 28, 2019 and entitled "Display Substrate, Preparation Method Thereof, and Display Apparatus". The present application claims priority and the benefit of the above-identified applications and the above-identified applications are incorporated by reference herein in their entirety.

TECHNICAL FIELD

Implementations of the present disclosure relate to but are not limited to a display substrate, a preparation method thereof and a display apparatus.

BACKGROUND

An Organic Light Emitting Diode (OLED) is an active light emitting display device, and has advantages of self-emission, wide view, high contrast, low power consumption, extremely high response speed, etc. With continuous development of the display technology, the OLED technology is increasingly applied to flexible display apparatuses, and flexible display apparatuses are gradually developing from a two-dimensional directional variable mode to a three-dimensional directional variable mode.

At present, island and bridge structure is usually adopted for the flexible OLED display apparatus. The island and bridge structure is characterized in that an emitting unit is arranged in a pixel island region, and a connection line between the pixel islands is arranged in a connection bridge region. When an external force is applied to stretch, deformation mainly appears in the connection bridge region, and the emitting unit in the pixel island region substantially maintains its shape, so that the emitting unit in the pixel island region can be guaranteed not to be damaged. In order to increase the deformability of the flexible display apparatus, a series of small apertures are also provided, so the flexible OLED display apparatus is composed of pixel island regions where emitting units are located, connection bridge regions where inter-island connection lines are located, and aperture regions penetrating through the flexible base substrate.

For a flexible OLED display apparatus with a small aperture structure, it is not only necessary to independently encapsulate each pixel island region, but also to cut off an organic emitting layer and cathode of the emitting unit in the aperture region, since if the aperture region contains the organic emitting layer and cathode, the side wall of the small aperture will expose the organic emitting layer and cathode, but the organic emitting layer and cathode exposed to the atmosphere will quickly fail. To cut off the organic emitting layer and the cathode in the aperture region, patterning processes of the organic emitting layer and cathode are usually adopted, such as evaporating the organic emitting layer and cathode only in the island region by using a high-precision metal mask. However, it is shown in actual application that this encapsulation solution is not only difficult in design and high-cost in manufacture, but also very difficult in process realization.

Therefore, how to solve the problems of difficult design, high manufacturing cost and difficult process realization in the above encapsulation solution is a technical problem to be solved urgently in this field.

SUMMARY

The following is a summary of the subject matter described in detail herein. This summary is not intended to limit the protection scope of the claims.

In an aspect, an implementation of the present disclosure provides a display substrate. The display substrate includes a base substrate, a plurality of pixel island regions distributed in an array and spaced apart from each other, a plurality of aperture regions, and connection bridge regions located between pixel island regions and aperture regions, which are disposed on the base substrate, wherein the connection bridge region is provided with an isolation structure layer for cutting off an organic emitting layer and a cathode in the connection bridge region.

In an exemplary implementation, an pixel island region includes a driving structure layer and a first pixel define layer defining a pixel opening region; the connection bridge region includes a connection line for signal communication between adjacent pixel island regions and a second pixel define layer covering the connection line; and the isolation structure layer is disposed on the second pixel define layer.

In an exemplary implementation, the first pixel define layer in the pixel island region and the second pixel define layer in the connection bridge region are made of a same material.

In an exemplary implementation, the isolation structure layer includes a plurality of columns arranged at intervals, and an area of an orthographic projection of a remote end of a column away from the base substrate on a plane parallel to the base substrate is larger than an area of an orthographic projection of a near end of the column close to the base substrate on the plane parallel to the base substrate.

In an exemplary implementation, the isolation structure layer includes a plurality of columns arranged at intervals, and in a plane perpendicular to the base substrate, in a cross section of a column, a width of a remote end of the column away from the base substrate is greater than a width of a near end of the column close to the base substrate.

In an exemplary implementation, a height of the column is 1 μm to 4 μm, the width of the remote end of the column away from the base substrate is 5 μm to 10 μm, the width of the near end of the column close to the base substrate is 3 μm to 7 μm, and a distance between adjacent columns is 3 μm to 10 μm.

In an exemplary implementation, a shape of the cross section of the column includes an inverted trapezoid, and an included angle between an upper edge and a side edge of the inverted trapezoid is 30° to 80°.

In an exemplary implementation, the isolation structure layer further includes an inorganic water-blocking layer wrapping the plurality of columns.

In an exemplary implementation, a material of the inorganic water-blocking layer includes silicon nitride, silicon oxide, silicon oxynitride or aluminum oxide, and a material of the isolation structure layer includes negative resist.

In an exemplary implementation, the aperture region includes a plurality of small grooves or small apertures penetrating through the base substrate.

In a further aspect, an implementation of the present disclosure further provides a display apparatus, including the above display substrate.

In another aspect, an implementation of the present disclosure further provides a preparation method for a display substrate, including: forming, on a base substrate, a plurality of pixel island regions distributed in an array and spaced apart from each other, a plurality of aperture regions, and connection bridge regions located between pixel island regions and aperture regions; forming an isolation structure layer in the connection bridge region; and forming an organic emitting layer and a cathode, wherein the organic emitting layer and the cathode in the connection bridge region are cut off by the isolation structure layer.

In an exemplary implementation, forming, on the base substrate, the plurality of pixel island regions distributed in the array and spaced apart from each other, the plurality of aperture regions, and the connection bridge regions located between the pixel island regions and the aperture regions includes: forming a driving structure layer in the pixel island region of the base substrate, forming a connection line for signal communication between adjacent pixel island regions in the connection bridge region of the base substrate, and forming small grooves or small apertures penetrating through the base substrate in an aperture region of the base substrate; and forming a pixel define layer, wherein the pixel define layer includes a first pixel define layer located in the pixel island region and a second pixel define layer located in the connection bridge region, and the first pixel define layer defines a pixel opening region, and the second pixel define layer covers the connection line.

In an exemplary implementation, forming the isolation structure layer in the connection bridge region includes: coating a layer of negative resist, and forming the isolation structure layer on the second pixel define layer in the connection bridge region through mask, exposure and development, wherein the isolation structure layer includes a plurality of columns arranged at intervals; in a plane perpendicular to the base substrate, in a cross section of a column, a width of a remote end of the column away from the base substrate is larger than a width of a near end of the column close to the base substrate.

In an exemplary implementation, forming the isolation structure layer in the connection bridge region includes: coating a layer of negative resist, and forming the isolation structure layer on the second pixel define layer in the connection bridge region through mask, exposure and development, wherein the isolation structure layer includes a plurality of columns arranged at intervals, and an area of an orthographic projection of a remote end of a columns away from the base substrate on a plane parallel to the base substrate is larger than an area of an orthographic projection of a near end of the column close to the base substrate on the plane parallel to the base substrate.

In an exemplary implementation, forming the isolation structure layer in the connection bridge region further includes: depositing an inorganic water-blocking film, and forming an inorganic water-blocking layer wrapping the plurality of columns in the connection bridge region through a patterning process, wherein a material of the inorganic water-blocking layer includes silicon nitride, silicon oxide, silicon oxynitride or aluminum oxide.

Of course, it is not necessary to achieve all of the advantages mentioned above to implement any product or method of the implementations of the present disclosure. Other features and advantages of implementations of the present disclosure will be set forth in implementations of the description below, and in part will become apparent from the implementations of the description, or may be learned by practice the implementations of the present disclosure. Purposes and other advantages of the technical solutions of the present disclosure may be realized and acquired by structures specified in the specification, claims and drawings. Other aspects will become apparent upon reading and understanding the drawings and detailed description.

BRIEF DESCRIPTION OF DRAWINGS

Accompanying drawings are used to provide a further understanding of technical solutions of the present disclosure, form a part of the specification, and explain technical solutions of the present disclosure together with implementations of the present disclosure, while they do not constitute a limitation on the technical solutions of the present disclosure. Shapes and sizes of the components shown in the drawings do not reflect real proportions, and are only for the purpose of schematically illustrating contents of implementations of the present disclosure.

EXPLANATION OF THE REFERENCE SIGNS

1—Glass carrier plate;
10—Base substrate;
11—Barrier layer;
12—Active layer;
13—First insulating layer;
14—First gate electrode;
15—Second gate electrode;
16—Second insulating layer;
17—Capacitance electrode;
18—Third insulating layer;

19—Source electrode;
20—Drain electrode;
21—Fourth insulating layer;
31—Anode;
32—First pixel define layer;
33—Organic emitting layer;
34—Cathode;
35—Encapsulation layer;
100—Pixel island region;
200—Connection bridge region;
300—Aperture region;
101—Thin film transistor;
201—Connection line;
202—Second pixel define layer;
203—Isolation structure layer;
204—Inorganic water-blocking layer.

DETAILED DESCRIPTION

Specific implementations of the present disclosure will be described in further detail below with reference to the accompanying drawings and implementations. The following implementations are used to illustrate the technical solutions of the present disclosure, but are not used to limit the scope of the present disclosure. Without a conflict, implementations of the present disclosure and features in the implementations may be combined with each other arbitrarily.

Implementations of the present disclosure provide a display substrate, a preparation method thereof and a display apparatus, which do not need to use patterning processes for an organic emitting layer and a cathode, and can have the advantages of low design difficulty, low manufacturing cost, easy process realization, effective guarantee of encapsulation effectiveness and reliability, and the like. A display substrate in an implementation of the present disclosure includes a base substrate, a plurality of pixel island regions distributed in an array and spaced apart from each other, a plurality of aperture regions, and connection bridge regions located between pixel island regions and aperture regions, which are disposed on the base substrate. The connection bridge region is provided with an isolation structure layer for cutting off an organic emitting layer and a cathode in the connection bridge region, so as to block a water vapor intrusion path from the aperture region to the organic emitting layer and the cathode in the pixel island region.

In an implementation of the present disclosure, each pixel island region may include one or more emitting units, each emitting unit serves as a sub-pixel, and three emitting units emitting different colors of light (such as red, green and blue) or four emitting units emitting different colors of light (such as red, green, blue and white) constitute one pixel unit. Thus, each pixel island region includes one or more pixel units. Each emitting unit in each pixel island region includes a driving structure layer containing a plurality of Thin Film Transistors (TFTs) and an emitting structure layer containing an anode, an organic emitting layer, and a cathode. Each connection bridge region includes a connection line, an isolation structure layer, an organic emitting layer and cathode which are disposed on the isolation structure layer and are cut off by the isolation structure layer, so that an organic emitting layer and a cathode in the pixel island region are cut off from the organic emitting layer and the cathode in the connection bridge region. In an implementation of the present disclosure, the connection line disposed in the connection bridge region is used for signal communication between adjacent pixel island regions. Signal communication between adjacent pixel island regions refers to signal communication between emitting units in one pixel island region and emitting units in another adjacent pixel island region. For example, the connection line may connect a gate line in an adjacent pixel island region or may connect a data line in an adjacent pixel island region. In an implementation of the present disclosure, the aperture region includes a plurality of small grooves or small apertures, and structural film layers and the base substrate in each small groove or small aperture are removed for realizing a stretching function of a stretchable display substrate.

In the stretchable and flexible OLED display substrate provided by the implementation of the present disclosure, the isolation structure layer for cutting off the organic emitting layer and the cathode in the connection bridge region is disposed in each connection bridge region, thus completely blocking a water vapor intrusion path from the aperture region to the organic emitting layer and the cathode in the pixel island region, effectively guaranteeing effectiveness and reliability of encapsulation, and having the advantages of low design difficulty, low manufacturing cost, easy process realization and the like.

Figure 1:
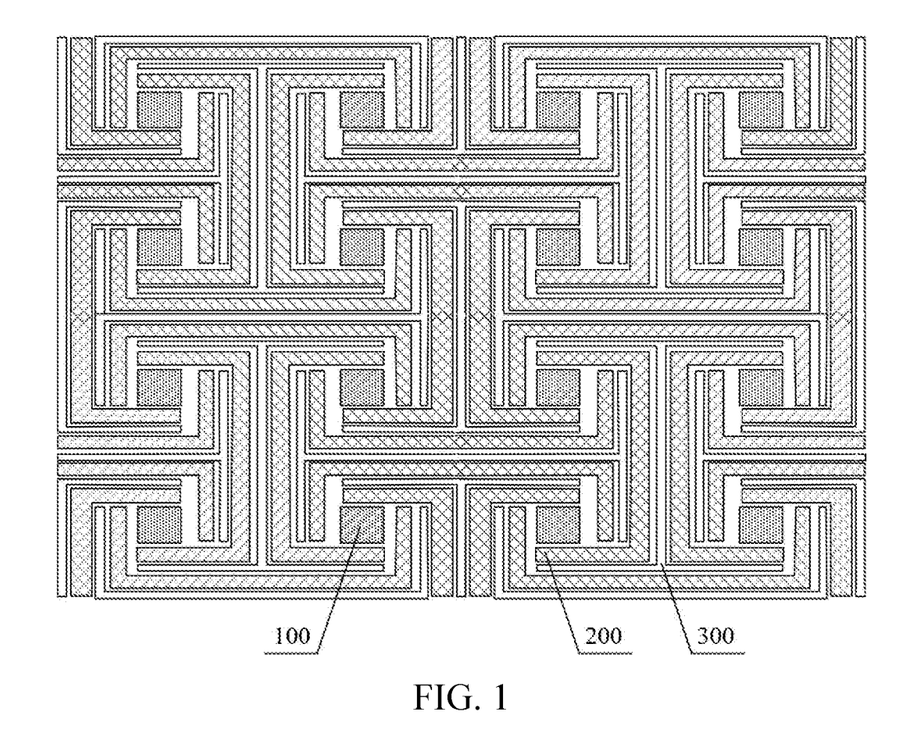
FIG. 1 is a schematic diagram of structure of an OLED display substrate according to an implementation of the present disclosure.
Figure 2:
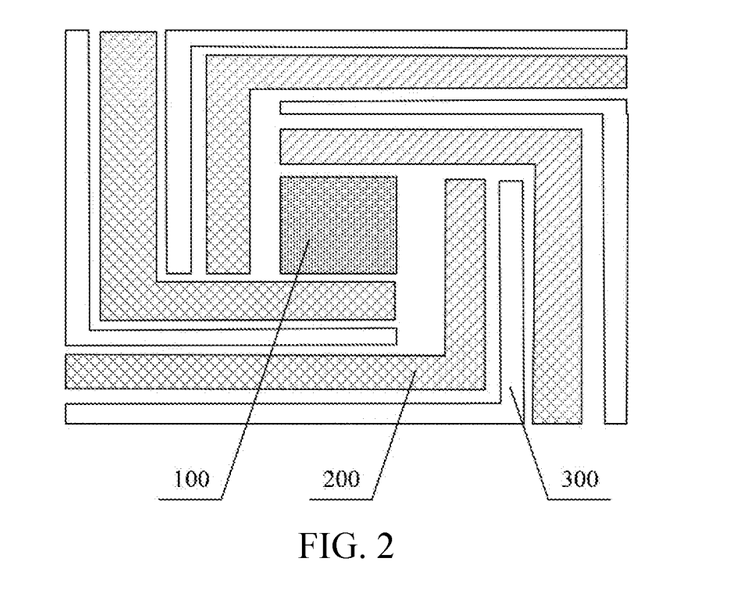
FIG. 2 is an enlarged view of one pixel island region in FIG. 1.
Figure 3:
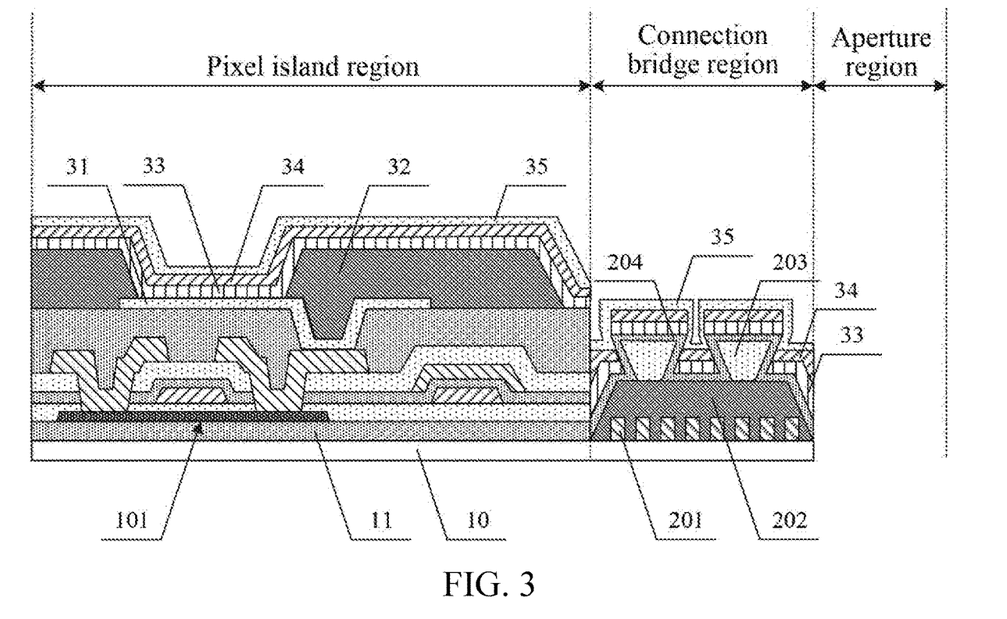
FIG. 3 is a section view of the pixel island region, the connection bridge region and the aperture region in FIG. 2.

FIG. 1 is a schematic diagram of structure of a display substrate according to an implementation of the present disclosure. FIG. 2 is an enlarged view of one pixel island region in FIG. 1. FIG. 3 is a section view of the pixel island region, the connection bridge region, and the aperture region in FIG. 2. As shown in FIGS. 1 to 3, the display substrate in the implementation of the present disclosure includes a plurality of pixel island regions 100 distributed in an array and spaced apart from each other, a plurality of aperture regions 300, and connection bridge regions 200 located between pixel island regions 100 and aperture regions 300.

In an exemplary implementation, each pixel island region 100 may include one or more emitting units, each emitting unit includes a driving structure layer and an emitting structure layer, and the driving structure layer includes a plurality of thin film transistors. An example of only one emitting unit and one thin film transistor is illustrated in FIG. 3. The driving structure layer includes a barrier layer 11 disposed on a base substrate 10 and a thin film transistor 101 disposed on the barrier layer 11. The emitting structure layer includes an anode 31 connected with a drain electrode of the thin film transistor 101, a first pixel define layer 32 defining a pixel opening region, an organic emitting layer 33 formed in the pixel opening region and on the first pixel define layer 32, a cathode 34 formed on the organic emitting layer 33, and an encapsulation layer 35 covering the above structures.

In an exemplary implementation, the connection bridge region 200 includes a connection line 201 disposed on the base substrate 10, a second pixel define layer 202 covering the connection line 201, an isolation structure layer 203 disposed on the second pixel define layer 202, an inorganic water-blocking layer 204 wrapping the isolation structure layer 203, an organic emitting layer 33 and a cathode 34 which are disposed on the inorganic water-blocking layer 204 and are isolated by the isolation structure layer 203, and an encapsulation layer 35 covering the above structures.

In an exemplary implementation, the second pixel define layer 202 covering the connection line 31 in the connection bridge region 200 and the first pixel define layer 32 of the emitting structure layer in the pixel island region 100 are formed by the same process. The isolation structure layer 203 is made of a negative resist material and includes a plurality of columns arranged at intervals. On a plane perpendicular to the base substrate 10, a shape of a cross section of each column is wide in an upper part and narrow in a lower part, such as a shape of an inverted trapezoid.

In an exemplary implementation, the aperture region 300 includes a plurality of small grooves or small apertures, and each structure film layer and the base substrate in each small groove or small aperture are removed. Each small groove or small aperture has a strip shape on a plane parallel to the base substrate.

The technical solutions of implementations of the present disclosure are described below in detail through the preparation process of the display substrate in this implementation. The "patterning process" in this implementation includes film layer deposition, coating of photoresist, mask exposure, development, etching, stripping of photoresist, and so on. The "photolithography process" in this implementation includes film layer coating, mask exposure, development, and so on. The evaporation, deposition, spreading, coating, etc. in this implementation are known preparation processes in art.

FIGS. 4 to 11 are schematic diagrams showing a preparation process of a display substrate according to an implementation of the present disclosure. The preparation process of the display substrate may include the following (1)-(10).

(1) A flexible material is coated on a glass carrier plate 1, and is cured to form a film to form the base substrate 10. In this implementation, the base substrate 10 is a flexible base substrate with a thickness of 5 µm to 30 µm. The flexible material may be polyimide (PI), polyethylene terephthalate (PET) or a surface-treated polymer soft film or the like.

Figure 4:
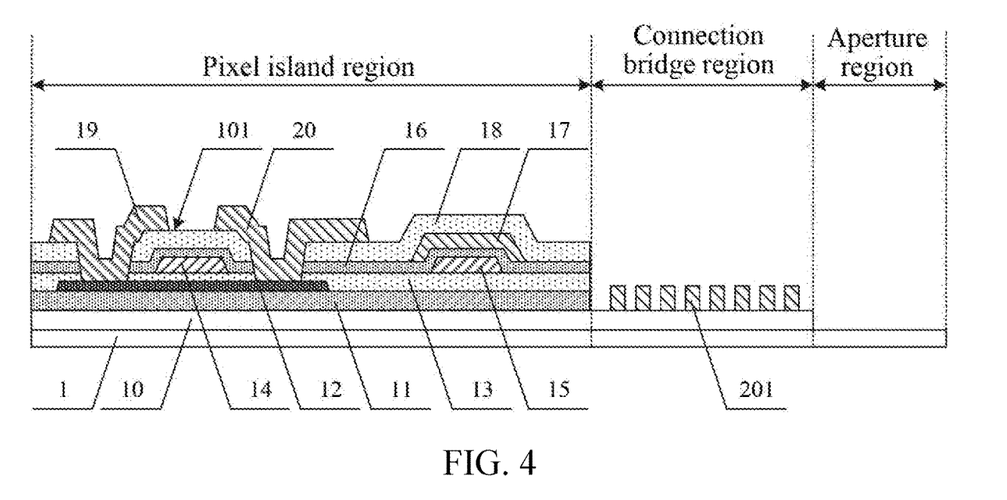
FIG. 4 is a schematic diagram according to an implementation of the present disclosure after patterns of a driving structure and a connection line are formed.

(2) Patterns of a driving structure and a connection line are prepared on the base substrate 10. The driving structure is disposed in the pixel island region, and the connection line is disposed in the connection bridge region. The driving structure includes a plurality of gate lines and a plurality of data lines. The plurality of gate lines and the plurality of data lines vertically cross to define a plurality of sub-pixels arranged in a matrix, and each sub-pixel is provided with a thin film transistor 101, as shown in FIG. 4. Related preparation process may include operations as follows.

First, a barrier film is deposited on the base substrate 10 to form a pattern of a barrier layer 11. Silicon nitride (SiNx), silicon oxide (SiOx) or the like may be used for the barrier film which may be a single layer or may be a multi-layer structure of the silicon nitride/silicon oxide. In this implementation, the barrier layer 11 is used for improving a capability of water oxygen resistance of the base substrate 10.

Next, an active layer film is deposited and is patterned through a patterning process to form a pattern of the active layer 12 disposed on the barrier layer 11 in the pixel island region. In this patterning process, the active layer film and the barrier layer 11 in the connection bridge region are etched away to expose the base substrate 10, and the active layer film, the barrier layer 11 and the base substrate 10 in the aperture region are all etched away.

Subsequently, a first insulating film and a first metal film are sequentially deposited, and the first metal film is patterned by a patterning process to form patterns of a first insulating layer 13 covering the active layer 12 in the pixel island region, a first gate electrode 14 and a second gate electrode 15 and a gate line (not shown in the figure) disposed on the first insulating layer 13. In this patterning process, the first metal films in the connection bridge region and the aperture region are etched away, leaving the first insulating film.

Then, a second insulating film and a second metal film are sequentially deposited, and the second metal film is patterned by a patterning process to form patterns of a second insulating layer 16 covering the first gate electrode 14, the second gate electrode 15, and the gate line in the pixel island region, and a capacitance electrode 17 disposed on the second insulating layer 16. A position of the capacitance electrode 17 corresponds to a position of the second gate electrode 15, and the capacitance electrode 17 and the second gate electrode 15 form a capacitance. In this patterning process, the second metal films in the connection bridge region and the aperture region are etched away, leaving the second insulating film.

Subsequently, a third insulating film is deposited and is patterned by a patterning process to form a pattern of a third insulating layer 18 provided with two first vias in the pixel island region. The third insulating films, the second insulating films and the first insulating films in the two first vias are etched away to expose the active layer 12. Herein, the first insulating layer and the second insulating layer are also called a gate insulating layer (GI), and the third insulating layer is also called an interlayer insulating layer (also referred to as Interlayer Dielectric, ILD). In this patterning process, the third insulating films, the second insulating films and the first insulating films in the connection bridge region and the aperture region are etched away.

After that, a third metal film is deposited and is patterned through a patterning process to form patterns of a source electrode 19, a drain electrode 20 and a data line (not shown in the figure) in the pixel island region and form a pattern of a connection line 201 in the connection bridge region. The source electrode 19 and the drain electrode 20 are connected to the active layer 12 respectively through two first vias; and the connection line 201 is disposed on the base substrate 10. In this patterning process, the third metal film in the aperture region is etched away. So far, preparation of patterns of the driving structure and the connection line on the base substrate 10 has been completed, as shown in FIG. 4.

The periphery of the pixel island region is formed with connection bridge regions in two directions (a horizontal direction and a vertical direction), the connection line in the connection bridge region in one direction at least include a first voltage line, a second voltage line and a data connection line, and the connection line in the connection bridge region in the other direction at least include a gate connection line. In FIG. 4, the connection line in the connection bridge region in one direction is only illustrated. The connection line is on the same layer as the data line and is formed by the same patterning process as the data line. The connection line in the connection bridge region in the other direction is on the same layer as the gate line and is formed by the same patterning process as the gate line.

(3) A fourth insulating film is coated on the base substrate on which the above patterns are formed, and a pattern of a fourth insulating layer 21 covering the source electrode 19 and the drain electrode 20 is formed in the pixel island region through photolithography processes of mask, exposure and development. The fourth insulating layer 21 is provided with a second via exposing the drain electrode 20. The fourth insulating layer is also called a planarization layer (PLN). In the photolithography process of this step, the fourth insulating films in the connection bridge region and the aperture region are developed away.

Figure 5:
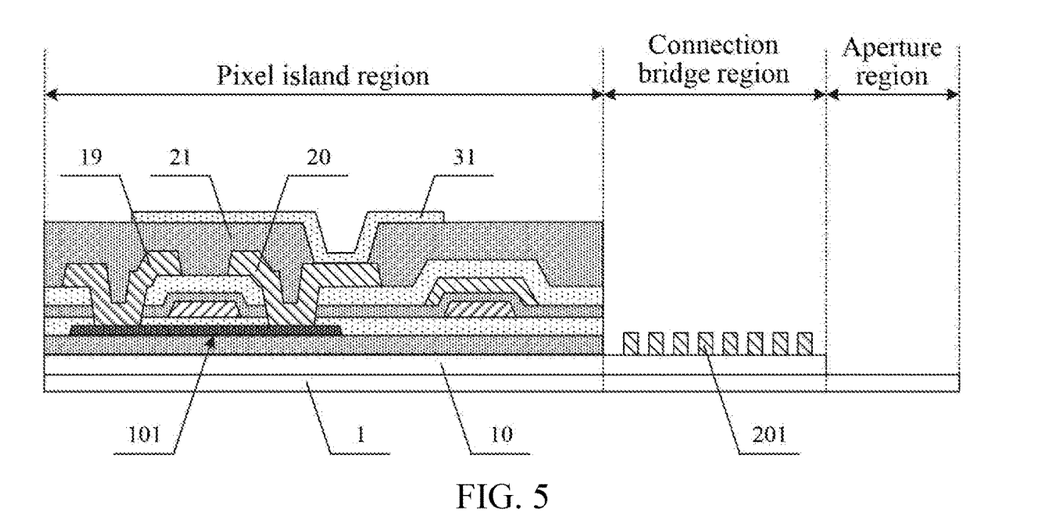
FIG. 5 is a schematic diagram according to an implementation of the present disclosure after a pattern of an anode is formed.

(4) A transparent conductive film is deposited on the base substrate on which the above patterns are formed, and the transparent conductive film is patterned through a patterning process to form a pattern of an anode 31 in the pixel island region. The anode 31 is connected to the drain electrode 20 through the second via, as shown in FIG. 5. The transparent conductive film may be made of indium tin oxide (ITO) or indium zinc oxide (IZO). In the patterning process of this step, the transparent conductive films in the connection bridge region and the aperture region are etched away.

Figure 6:
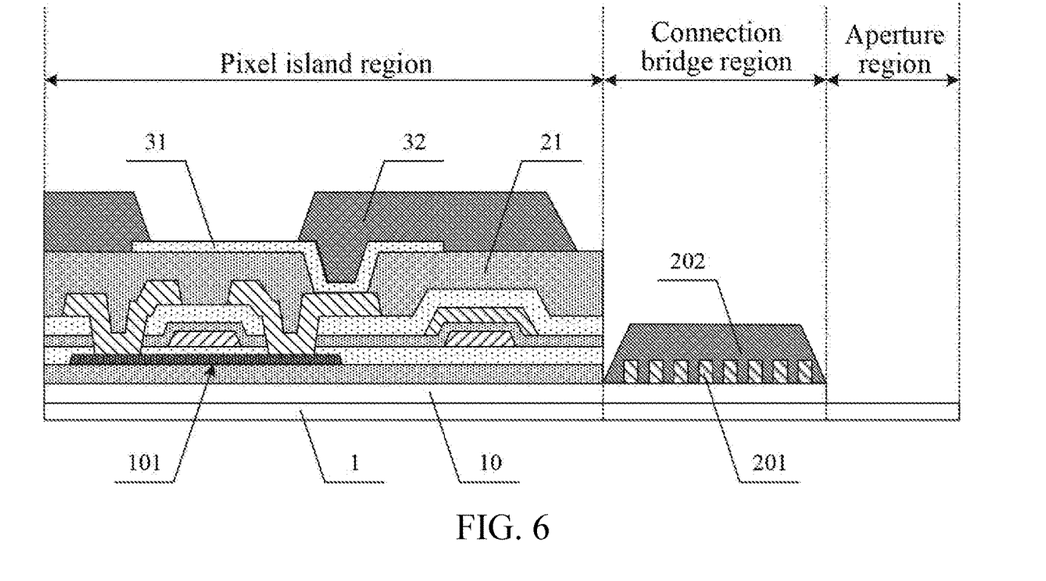
FIG. 6 is a schematic diagram according to an implementation of the present disclosure after a pattern of a pixel define layer is formed.

(5) A pixel define film is coated on the base substrate on which the above patterns are formed, and a pattern of the pixel define layer is formed through a photolithography process. The pixel define layer includes a pattern of a first pixel define layer 32 located in the pixel island region and a pattern of a second pixel define layer 202 located in the connection bridge region, namely, the pattern of the first pixel define layer 32 and the pattern of the second pixel define layer 202 pattern are formed through the same photolithography process. The first pixel define layer 32 and the second pixel define layer 202 are made of the same material, and the first pixel define layer 32 defines a pixel opening region exposing the anode 31 in each sub-pixel, and the second pixel define layer 202 covers the connection line 201, as shown in FIG. 6. Herein, polyimide, acrylic or polyethylene terephthalate or the like may be used in the pixel define layer. In the photolithography process of this step, the pixel define film in the aperture region is developed away.

Figure 7:
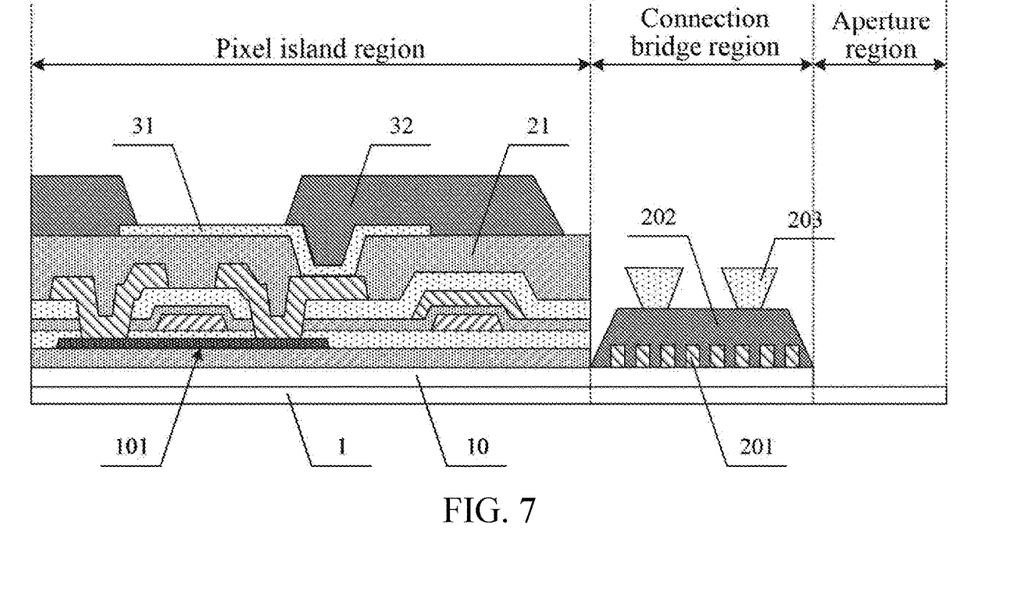
FIG. 7 is a schematic diagram according to an implementation of the present disclosure after a pattern of an isolation structure layer is formed.

(6) A layer of negative resist is coated on the base substrate on which the above patterns are formed, and a pattern of the isolation structure layer 203 is formed on the connection bridge region through a photolithography process. The isolation structure layer 203 includes a plurality of columns arranged at intervals. On a plane parallel to the base substrate 10, a shape of a cross section of each column is rectangular, circular or oval, or the like. On a plane perpendicular to the base substrate 10, a shape of the cross section of each column has a characteristic of wide in an upper part and narrow in a lower part, i.e., a width of a remote end (an upper end) of the column away from the base substrate 10 is larger than a width of a near end (a lower end) of the column close to the base substrate 10, as shown in FIG. 7. Upper ends of all the cross sections are combined to form the upper end of the column, and lower ends of all the cross sections are combined to form the lower end of the column. Since the cross sections are wide in the upper part and narrow in the lower part, an area of the upper end of the column is larger than an area of the lower end of the column, that is, an area of an orthographic projection of a remote end (the upper end) of the column away from the base substrate 10 on a plane parallel to the base substrate 10 is larger than an area of an orthographic projection of a near end (the lower end) of the column close to the base substrate 10 on the plane parallel to the base substrate 10. A height of the column is 1 μm to 4 μm, a width of the upper end of the column is 5 μm to 10 μm (the width of the upper end of the column is a distance between two points farthest from each other at the upper end of the column), a width of the lower end of the column is 3 μm to 7 μm (the width of the lower end of the column is a distance between two points farthest from each other at the lower end of the column), and a distance between adjacent columns is 3 μm to 10 μm. In an exemplary implementation, on a plane perpendicular to the base substrate 10, a shape of the cross section of each column is an inverted trapezoid, and an included angle between an upper edge and a side edge of the inverted trapezoid is 30° to 80°. In this photolithography process, the negative resist in the pixel island region and the aperture region is developed away. In this implementation, a plurality of columns arranged at intervals are arranged in an inverted trapezoid in order to cut off the organic emitting layer and cathode evaporated subsequently in the connection bridge region and block a water vapor intrusion path from the aperture region to the pixel island region. In one implementation, the isolation structure layer 203 may be made of an inorganic material.

Figure 8:
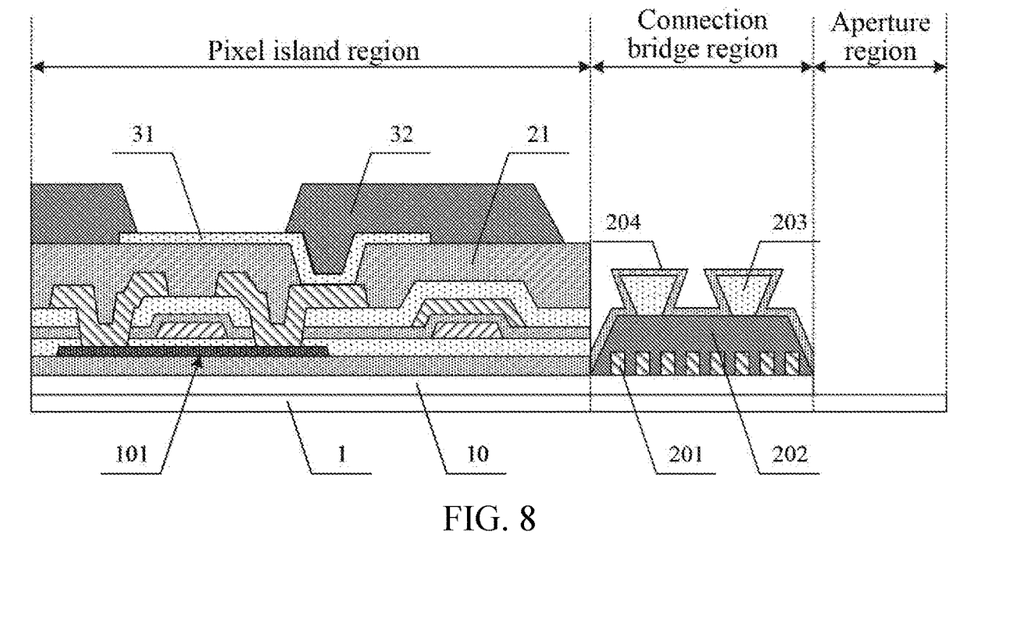
FIG. 8 is a schematic diagram according to an implementation of the present disclosure after a pattern of an inorganic water-blocking layer is formed.

(7) An inorganic water-blocking film is deposited on the base substrate on which the above patterns are formed, and is patterned through a patterning process, and a pattern of an inorganic water-blocking layer 204 wrapping a plurality of columns of the isolation structure layer 203 is formed in the connection bridge region, as shown in FIG. 8. In this patterning process, the inorganic water-blocking films in the pixel island region and the aperture region are etched away, i.e., the inorganic water-blocking layers in the display region and the aperture region are cleared. The inorganic water-blocking film may be made of silicon nitride SiNx, silicon oxide SiOx, silicon oxynitride Si(ON)x or aluminum oxide AL2O3, and may have a single-layer, double-layer or multi-layer structure, and may be deposited by chemical vapor deposition (CVD), Atomic Layer Deposition (ALD), magnetron Sputter, or the like.

Figure 9:
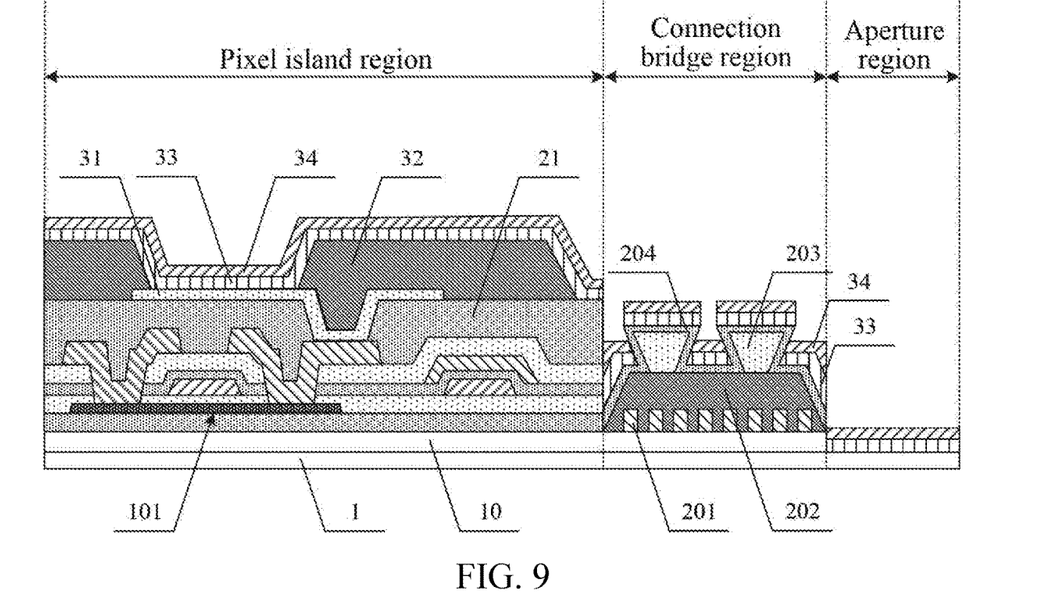
FIG. 9 is a schematic diagram according to an implementation of the present disclosure after patterns of an organic emitting layer and a cathode are formed.

(8) An organic emitting material and a cathode metal film are sequentially evaporated on the base substrate on which the above patterns are formed, to form patterns of an organic emitting layer 33 and a cathode 34. In the pixel island region, the organic emitting layer 33 is connected to the anode 31 in the pixel opening region defined by the first pixel define layer 32, and the cathode 34 is disposed on the organic emitting layer 33. In the connection bridge region, since the isolation structure layer 203 is disposed in this region, a plurality of columns of the isolation structure layer 203 cause the organic emitting layer 33 and the cathode 34 to break at the side walls of the columns, thus cutting off the organic emitting layer 33 and the cathode 34 in the connection bridge region. In the aperture region, an organic emitting layer 33 and a cathode 34 are formed on a glass carrier plate 1, as shown in FIG. 9. The organic emitting layer 33 includes an emitting layer (EML). In one implementation, the organic emitting layer 33 may include a hole injection layer, a hole transporting layer, an emitting layer, an electron transporting layer, and an electron injection layer disposed sequentially to improve the efficiency of injecting electrons and holes into the emitting layer. The cathode 34 may be made of one of metal materials such as magnesium Mg, argentum Ag, aluminum Al, copper Cu, lithium Li, or an alloy made of one or more of the above metals.

Figure 10:
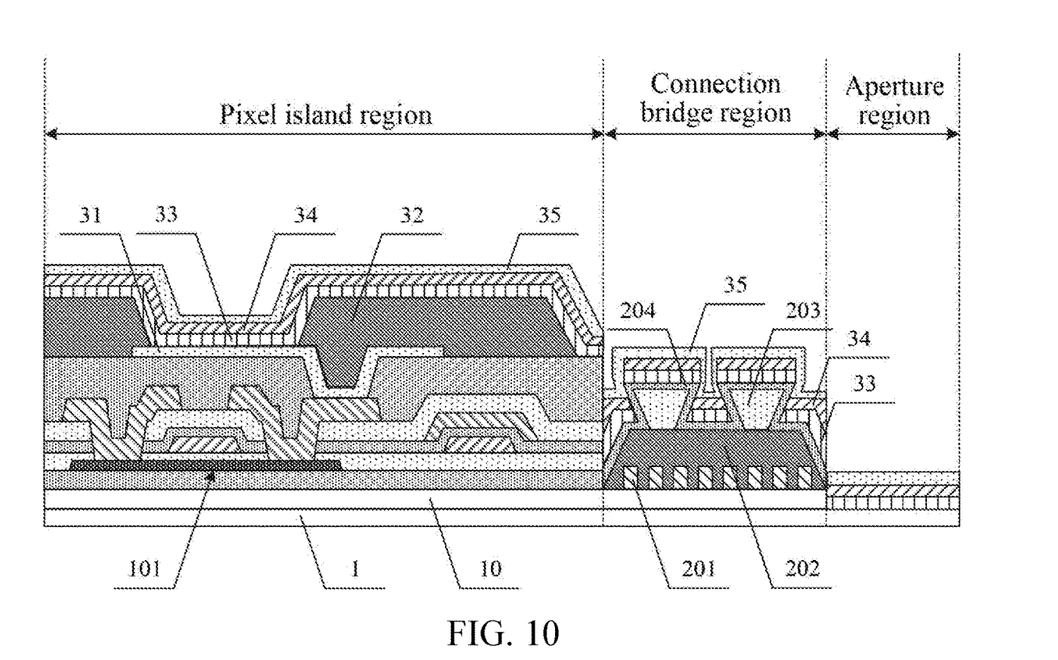
FIG. 10 is a schematic diagram according to an implementation of the present disclosure after a pattern of an encapsulation layer is formed.
Figure 11:
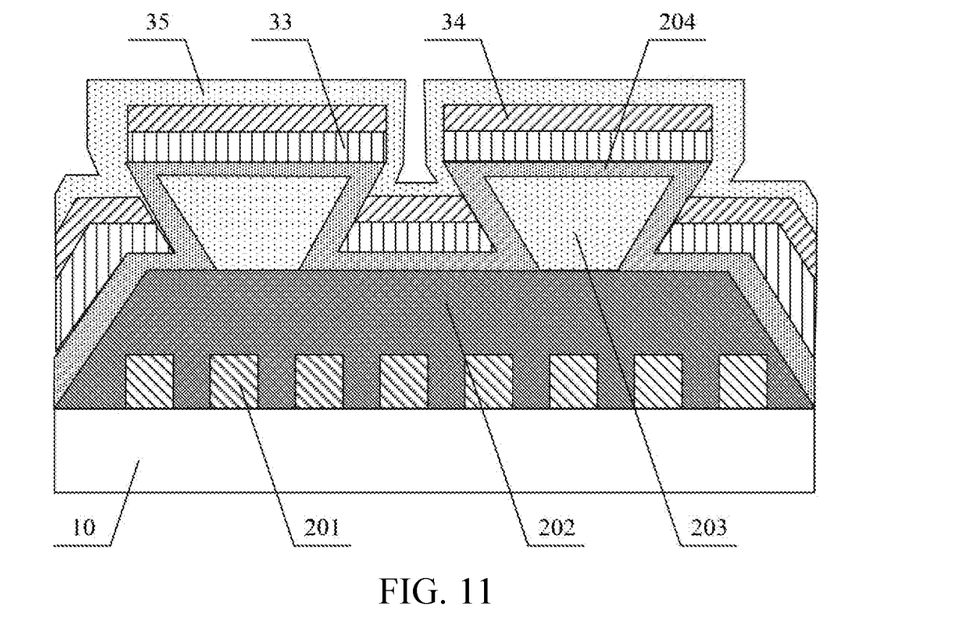
FIG. 11 is an enlarged view of the connection bridge region in FIG. 10.

(9) An encapsulation film is coated on the base substrate on which the above patterns are formed, and covers the pixel island region, the connection bridge region and the aperture region to form a pattern of an encapsulation layer 35, as shown in FIGS. 10 and 11. FIG. 11 is an enlarged view of the connection bridge region in FIG. 10. In one implementation, the encapsulation film may be made of an inorganic material/organic material/a stacked structure of an inorganic material.

(10) The glass carrier plate 1 is stripped to form the stretchable and flexible OLED display substrate according to the implementation of the present disclosure, as shown in FIG. 3. Since the organic emitting layer 33, the cathode 34 and the encapsulation layer 35 in the aperture region are directly formed on the glass carrier plate 1, the above-mentioned film layers are stripped off the aperture region together when the glass carrier plate 1 is stripped.

Figure 12:
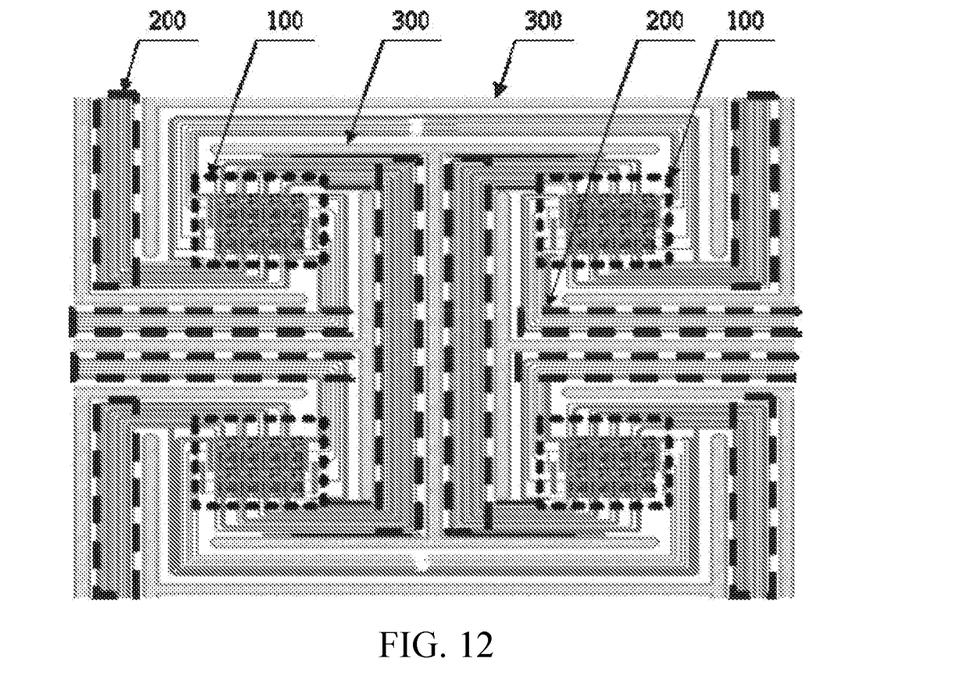
FIG. 12 is a schematic diagram of an OLED display substrate prepared according to an implementation of the present disclosure.

FIG. 12 is a schematic diagram of a display substrate prepared according to an implementation of the present disclosure. As shown in FIG. 12, a planar structure of the display substrate includes a plurality of pixel island regions 100 spaced apart from each other, connection bridge regions

200 providing connection between the plurality of pixel island regions 100, and apertures regions 300 composed of a plurality of small grooves or small apertures penetrating through the base substrate. The connection bridge region 200 is located between the pixel island region 100 and the aperture region 300.

In an implementation of the present disclosure, each pixel island region 100 may include a plurality of pixel units, each pixel unit includes three or four emitting units emitting light of different colors, that is, a plurality of pixel units as a group form one pixel island region, and in a plane parallel to the base substrate, each pixel island region may be rectangular or square with a width of 300 μm to 800 μm. The connection bridge region 200 at the periphery of each pixel island region has an L shape, or a shape formed by connecting a plurality of L shapes, such as a ⊔ shape, or a T shape, this implementation is not limited thereto.

In an implementation of the present disclosure, the connection lines provided in the connection bridge region 200 are respectively connected with a plurality of emitting units in an adjacent pixel island region 100, and a width of the connection bridge region is 40 μm to 100 μm. The aperture region 300 at the periphery of each pixel island region has an L shape, or a shape formed by connecting a plurality of L shapes, such as a shape of a Chinese character "エ", or a T shape, this implementation is not limited thereto. All structure film layers and the base substrate of the aperture region 300 arranged between the connection bridge regions 200 are removed to realize the stretching function of the stretchable display substrate.

As can be seen from the above preparation process, in the stretchable and flexible OLED display substrate provided by the implementation of the present disclosure, the isolation structure layer including the plurality of columns is disposed in each connection bridge region, and the plurality of columns enables the organic emitting layer and the cathode to be cut off on the side walls of the columns, realizing the cutoff of the organic emitting layer and the cathode in the connection bridge region, therefore a water vapor intrusion path from the aperture region to the organic emitting layer and the cathode in the pixel island region is blocked. In the implementation of the present disclosure, although the side walls of the small aperture in the aperture region expose the organic emitting layer and the cathode, since the exposed organic emitting layer and cathode are only limited to an edge region of the small aperture, the organic emitting layer and the cathode in the edge region of the small aperture are not connected with the organic emitting layer and the cathode in other partitions of the connection bridge region, and are cut off with the organic emitting layer and the cathode in the pixel island region, therefore the water vapor intrusion path to the organic emitting layer and the cathode exposed by the side wall of the small aperture is completely blocked, which will not cause failure of the organic emitting layer and the cathode in the pixel island region. In addition, considering that the width of the connection bridge region is small, in the implementation of the present disclosure the inorganic water-blocking layer is disposed in each connection bridge region to enable that the plurality of columns of the isolation structure layer are wrapped by the inorganic water-blocking layer, thereby improving a water-blocking performance of the isolation structure layer, increasing an effective encapsulation distance, guaranteeing a sufficient effective encapsulation distance in the connection bridge area with the small width and the reliability of the device. The encapsulation distance of the pure inorganic material in a side encapsulation is called the effective distance, i.e. a length of the side wall of the column (a generatrix of the column) in this implementation, so the effective encapsulation distance is determined by the length of the side wall of the column. In one implementation, to increase the effective encapsulation distance, increasing the height of the inverted trapezoidal column or reducing the included angle between the upper base substrate and the side wall may be adopted to effectively increase the encapsulation distance under a smaller width. In addition, in the implementation of the present disclosure the pixel define layer covers the connection line in the connection bridge region, for example, from the front, which can guarantee the effective encapsulation of the connection line in the connection bridge region.

Since patterning processes of an organic emitting layer and a cathode are not adopted in the solutions of the implementations of the present disclosure, the design difficulty and the manufacturing cost are reduced. The solutions of the implementations of the present disclosure have the advantages of the low design difficulty and low manufacturing cost. Moreover, since the preparation process of the implementation of the present disclosure can use the existing preparation equipment, and may slightly improve the existing process, and can be well compatible with the existing preparation process, the process is simple to realize, easy to implement, high in production efficiency, the preparation process of the implementation of the present disclosure has the advantages of easy process realization, low production cost, high yield and the like, can effectively guarantee the effectiveness and reliability of encapsulation, and thus has good application prospect.

The structure and its preparation process shown in this implementation are merely illustrative. In actual implementation, according to actual needs corresponding structures may be changed and patterning processes may be added or reduced. For example, in one implementation, the connection bridge region may adopt an inorganic material to form the isolation structure layer, which can not only cut off the organic emitting layer and cathode in the connection bridge region, but also realize a water-blocking function to enable that water vapor cannot intrude the pixel island region along the isolation structure layer. For another example, the OLED display substrate may have a top emission structure, or may have a bottom emission structure. For another example, the thin film transistor may be a top gate structure, a bottom gate structure, or a dual gate structure, or a single gate structure. For another example, the thin film transistor may be an amorphous silicon (a-Si) thin film transistor, a low temperature polysilicon (LTPS) thin film transistor, or an oxide thin film transistor. For another example, other electrodes, leads, and structural film layers may be disposed in the driving structure layer and the emitting structure layer, and the implementations of the present disclosure are not specifically limited thereto.

On a basis of the technical concept of the above display substrate, an implementation of the present disclosure further provides a preparation method of the display substrate. The preparation method of the display substrate in the implementation of the present disclosure includes the following acts S1-S3.

In S1, a plurality of pixel island regions distributed in an array and spaced apart from each other, a plurality of aperture regions, and connection bridge regions between the pixel island regions and the aperture regions are formed on the base substrate.

In S2, an isolation structure layer is formed on the connection bridge region.

In S3, an organic emitting layer and a cathode are formed, wherein the organic emitting layer and the cathode in the connection bridge region are cut off by the isolation structure layer.

In an exemplary implementation, the act S1 includes the following S11-S12.

In S11, a driving structure layer is formed on a pixel island region of the base substrate, a connection line for signal communication between adjacent pixel island regions is formed in the connection bridge region of the base substrate, and small grooves or small apertures penetrating through the base substrate are formed in the aperture region of the base substrate.

In S11, a pixel define layer is formed, wherein the pixel define layer includes a first pixel define layer located in the pixel island region and a second pixel define layer located in the connection bridge region, and the first pixel define layer defines a pixel opening region, and the second pixel define layer covers the connection line.

In an exemplary implementation, the act S2 includes: a layer of negative resist is coated, and the isolation structure layer is formed on the second pixel define layer in the connection bridge region through mask, exposure and development, wherein the isolation structure layer includes a plurality of columns arranged at intervals; in a plane perpendicular to the base substrate, in a cross section of a column, a width of a remote end of the column away from the base substrate is larger than a width of a near end of the column close to the base substrate.

In an exemplary implementation, the act S2 includes: a layer of negative resist is coated, and an isolation structure layer is formed on the second pixel define layer in the connection bridge region through mask, exposure and development, wherein the isolation structure layer includes a plurality of columns arranged at intervals, and an area of an orthographic projection of a remote end of the column away from the base substrate on a plane parallel to the base substrate is larger than an area of an orthographic projection of a near end of the column close to the base substrate on the plane parallel to the base substrate.

In an exemplary implementation, a height of the column is 1 μm to 4 μm, the width of the remote end of the column away from the base substrate is 5 μm to 10 μm, the width of the near end of the column close to the base substrate is 3 μm to 7 μm, and a distance between adjacent columns is 3 μm to 10 μm.

In an exemplary implementation, a shape of the cross section of the column includes an inverted trapezoid, and an included angle between an upper base substrate and a side wall of the inverted trapezoid is 30° to 80°.

In an exemplary implementation, the act S2 further includes: an inorganic water-blocking film is deposited, and an inorganic water-blocking layer wrapping the plurality of columns in the connection bridge region is formed through a patterning process.

In an exemplary implementation, a material of the inorganic water-blocking layer includes silicon nitride, silicon oxide, silicon oxynitride or aluminum oxide.

In this implementation, the structures, materials, relevant parameters and detailed preparation processes of various film layers have been described in detail in the above implementations, and will not be described here again.

According to the preparation method of the display substrate provided by the implementation, the isolation structure layer for cutting off the organic emitting layer and the cathode in the connection bridge region is formed in each connection bridge region, thus completely blocking the water vapor intrusion path from the aperture region to the organic emitting layer and the cathode in the pixel island region, effectively guaranteeing effectiveness and reliability of the encapsulation. since the preparation process of the implementation can use the existing preparation equipment, and may slightly improve the existing process, and can be well compatible with the existing preparation process, the process is simple to realize, easy to implement, high in production efficiency, the preparation process of the implementation of the present disclosure has the advantages of easy process realization, low production cost, high yield and the like, can effectively guarantee the effectiveness and reliability of encapsulation, and thus has good application prospect.

An implementation of the present disclosure also provides a display apparatus, including the display substrate of the above implementation. The display apparatus may be any product or component with a display function such as a mobile phone, a tablet computer, a television, a display, a notebook computer, a digital photo frame, a navigator, etc.

In the description of the implementation of the present disclosure, it should be understood that azimuth or positional relationships indicated by terms "middle", "upper", "lower", "front", "rear", "vertical", "horizontal", "top", "bottom", "inside", "outside" and the like is based on the azimuth or positional relationship shown in the drawings, which is only for ease of description of the implementation of the present disclosure and simplification of the description, rather than indicating or implying that the device or element referred to must have a specific orientation, or must be constructed and operated in a particular orientation, and therefore cannot be construed as limiting of the implementation of the present disclosure.

In the description of the implementations of the present disclosure, terms "installed", "connected" and "connected" shall be broadly understood unless otherwise explicitly specified and defined, for example, it may be a fixedly connected, or removable connected, or integrally connected; it may be mechanically connected or electrically connected; it may be directly connected, or indirectly connected through an intermediate medium, or it may be communication inside two elements. For those of ordinary skill in the art, the specific meaning of the above terms in the implementations of the present disclosure may be understood according to a specific situation.

Although the implementations disclosed in the present disclosure are as the above, the contents are only implementations for facilitating understanding the present disclosure and are not used to limit the present disclosure. Any person skilled in the field to which the present disclosure pertains can make any modifications and variations in the forms and details of implementation without departing from the spirit and the scope disclosed in the present disclosure, but the patent protection scope of the present disclosure should still be subject to the scope defined by the appended claims.

What we claim is:

1. A display substrate, comprising a base substrate, a plurality of pixel island regions distributed in an array and spaced apart from each other, a plurality of aperture regions, and connection bridge regions located between the pixel island regions and the aperture regions, which are disposed on the base substrate, wherein a connection bridge region is provided with an isolation structure layer for cutting off an organic emitting layer and a cathode in the connection bridge region.

2. The display substrate according to claim 1, wherein a pixel island region comprises a driving structure layer and a first pixel define layer defining a pixel opening region; the connection bridge region comprises a connection line for signal communication between adjacent pixel island regions and a second pixel define layer covering the connection line; and the isolation structure layer is disposed on the second pixel define layer.

3. The display substrate according to claim 2, wherein the first pixel define layer in the pixel island region and the second pixel define layer in the connection bridge region are made of a same material.

4. The display substrate according to claim 2, wherein the isolation structure layer comprises a plurality of columns arranged at intervals, and an area of an orthographic projection of a remote end of a column away from the base substrate on a plane parallel to the base substrate is larger than an area of an orthographic projection of a near end of the column close to the base substrate on the plane parallel to the base substrate.

5. The display substrate according to claim 2, wherein the isolation structure layer comprises a plurality of columns arranged at intervals, and in a plane perpendicular to the base substrate, in a cross section of a column, a width of a remote end of the column away from the base substrate is greater than a width of a near end of the column close to the base substrate.

6. The display substrate according to claim 5, wherein a height of the column is 1 μm to 4 μm, the width of the remote end of the column away from the base substrate is 5 μm to 10 μm, the width of the near end of the column close to the base substrate is 3 μm to 7 μm, and a distance between adjacent columns is 3 μm to 10 μm.

7. The display substrate according to claim 5, wherein a shape of the cross section of the column comprises an inverted trapezoid, and an included angle between an upper edge and a side edge of the inverted trapezoid is 30° to 80°.

8. The display substrate according to claim 5, wherein the isolation structure layer further comprises an inorganic water-blocking layer wrapping the plurality of columns.

9. The display substrate according to claim 8, wherein a material of the inorganic water-blocking layer comprises silicon nitride, silicon oxide, silicon oxynitride or aluminum oxide, and a material of the isolation structure layer comprises negative resist.

10. The display substrate according to claim 1, wherein an aperture region comprises a plurality of small grooves or small apertures penetrating through the base substrate.

11. A display apparatus, comprising the display substrate according to claim 1.

12. A preparation method of a display substrate, comprising:
    forming, on a base substrate, a plurality of pixel island regions distributed in an array and spaced apart from each other, a plurality of aperture regions, and connection bridge regions located between pixel island regions and aperture regions;
    forming an isolation structure layer in a connection bridge region; and
    forming an organic emitting layer and a cathode, wherein the organic emitting layer and the cathode in the connection bridge region are cut off by the isolation structure layer.

13. The preparation method according to claim 12, wherein forming, on the base substrate, the plurality of pixel island regions distributed in the array and spaced apart from each other, the plurality of aperture regions, and the connection bridge regions located between the pixel island regions and the aperture regions comprises:
    forming a driving structure layer in a pixel island region of the base substrate, forming a connection line for signal communication between adjacent pixel island regions in the connection bridge region of the base substrate, and forming small grooves or small apertures penetrating through the base substrate in an aperture region of the base substrate; and
    forming a pixel define layer, wherein the pixel define layer comprises a first pixel define layer located in the pixel island region and a second pixel define layer located in the connection bridge region, and the first pixel define layer defines a pixel opening region, and the second pixel define layer covers the connection line.

14. The preparation method according to claim 13, wherein forming the isolation structure layer in the connection bridge region comprises:
    coating a layer of negative resist, and forming the isolation structure layer on the second pixel define layer in the connection bridge region through mask, exposure and development, wherein the isolation structure layer comprises a plurality of columns arranged at intervals; in a plane perpendicular to the base substrate, in a cross section of a column, a width of a remote end of the column away from the base substrate is larger than a width of a near end of the column close to the base substrate.

15. The preparation method according to claim 14, wherein forming the isolation structure layer in the connection bridge region further comprises:
    depositing an inorganic water-blocking film, and forming an inorganic water-blocking layer wrapping the plurality of columns in the connection bridge region through a patterning process, wherein a material of the inorganic water-blocking layer comprises silicon nitride, silicon oxide, silicon oxynitride or aluminum oxide.

* * * * *